United States Patent [19]

Keidar et al.

[11] Patent Number: 5,812,388
[45] Date of Patent: *Sep. 22, 1998

[54] BRIDGE RECTIFIER FOR DIODE-RECTIFIED ALTERNATING CURRENT GENERATOR

[75] Inventors: Zvi Keidar, Neveh-Monosson, Israel; Eugen Popa, Bucharest, Romania

[73] Assignee: Integral Automotive S.A., Rue Dicks, Luxembourg

[ * ] Notice: The term of this patent shall not extend beyond the expiration date of Pat. No. 5,646,838.

[21] Appl. No.: 571,804

[22] Filed: Dec. 13, 1995

[51] Int. Cl.⁶ .............................. H02K 11/00; H02M 1/00
[52] U.S. Cl. ......................................... 363/145; 310/68 D
[58] Field of Search .................................. 363/141, 144, 363/145; 310/68 D, 64

[56] References Cited

U.S. PATENT DOCUMENTS

| | | | |
|---|---|---|---|
| 4,321,664 | 3/1982 | Matthai | 363/141 |
| 4,604,538 | 8/1986 | Merrill et al. | 363/141 |
| 4,606,000 | 8/1986 | Steele et al. | 363/145 |
| 4,952,829 | 8/1990 | Armbruster et al. | 310/68 D |
| 5,043,614 | 8/1991 | Yockey | 363/145 |
| 5,451,823 | 9/1995 | Deverall et al. | 363/145 |
| 5,453,648 | 9/1995 | Bradfield | 363/141 |
| 5,473,208 | 12/1995 | Stihi | 310/68 D |
| 5,646,838 | 7/1997 | Keidar et al. | 363/145 |
| 5,682,070 | 10/1997 | Adachi et al. | 310/68 D |

Primary Examiner—Peter S. Wong
Assistant Examiner—Derek J. Jardieu
Attorney, Agent, or Firm—Lowe Hauptman Gopstein & Berner

[57] ABSTRACT

An improved bridge rectifier for an alternating current generator includes a first heat sink having a first diode, and an insulating layer disposed on the first heat sink. In addition, the improved bridge rectifier includes a second heat sink disposed on the insulating layer. The second heat sink includes a base section including first and second areas, a second diode, and a diode receiving holes in the base section and receiving the second diode therein. The second heat sink also includes a plateau section disposed on the first area of the base section, and air passages disposed in and extending through the base and plateau sections. The improved bridge rectifier further includes connectors, connecting the first heat sink and the second heat sink together with the insulating layer disposed therebetween, a cover connected to the base section and covering the second area of the base section, and a capacitor connected to the cover and to the second heat sink.

14 Claims, 19 Drawing Sheets

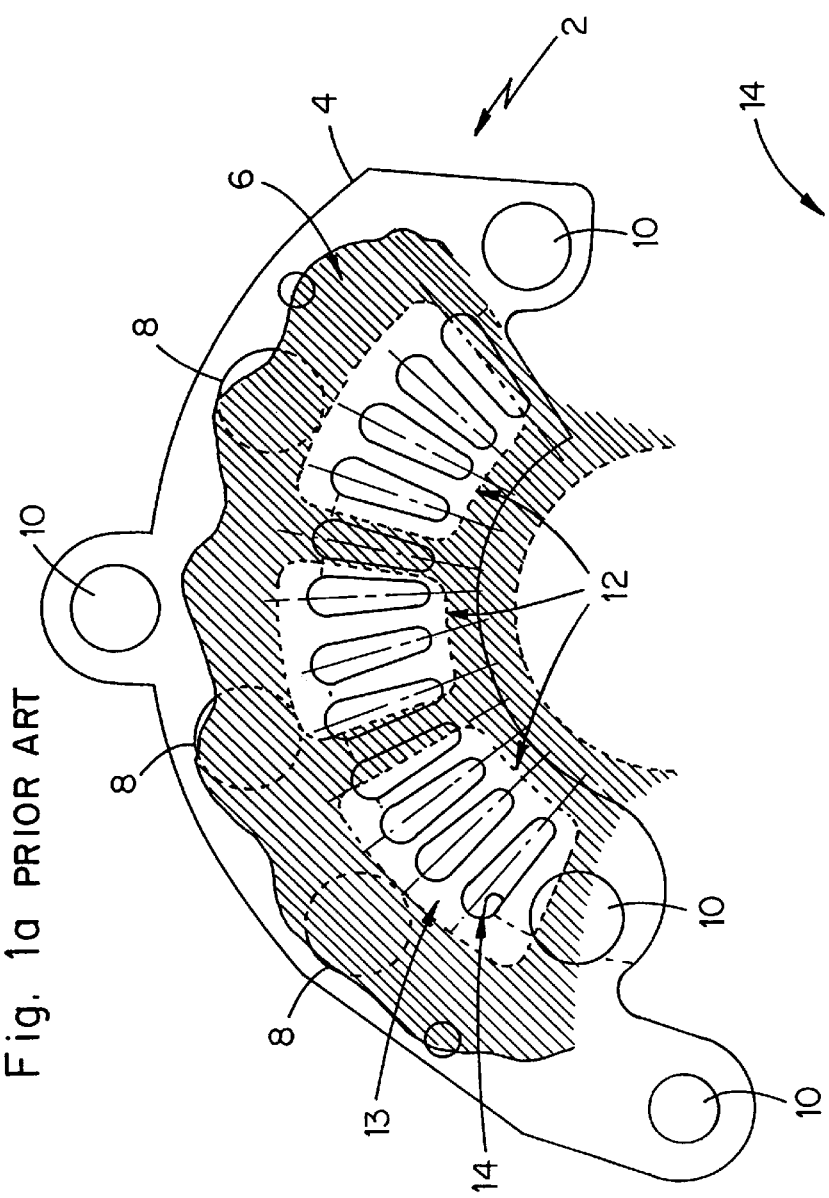
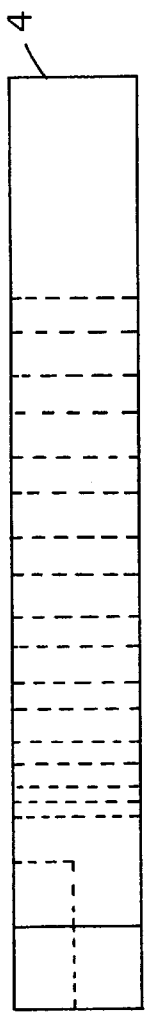

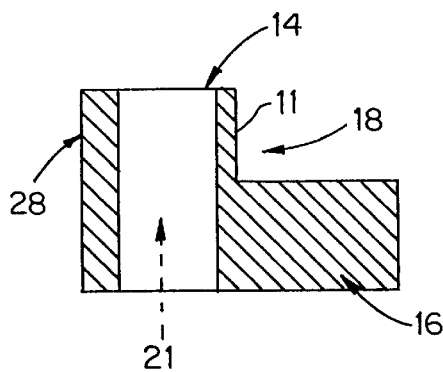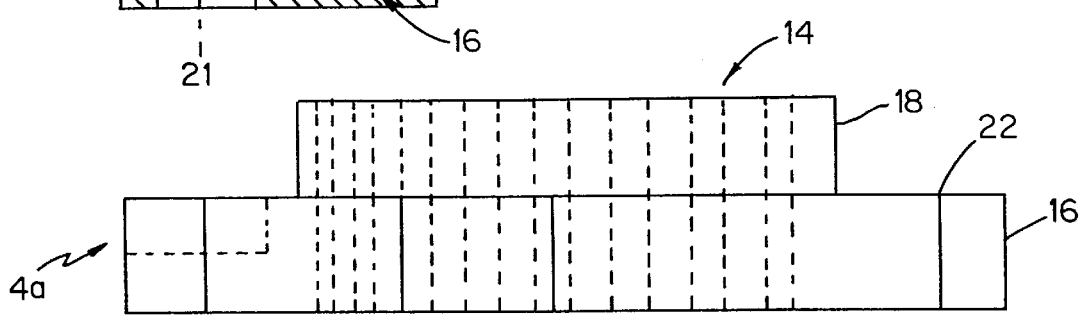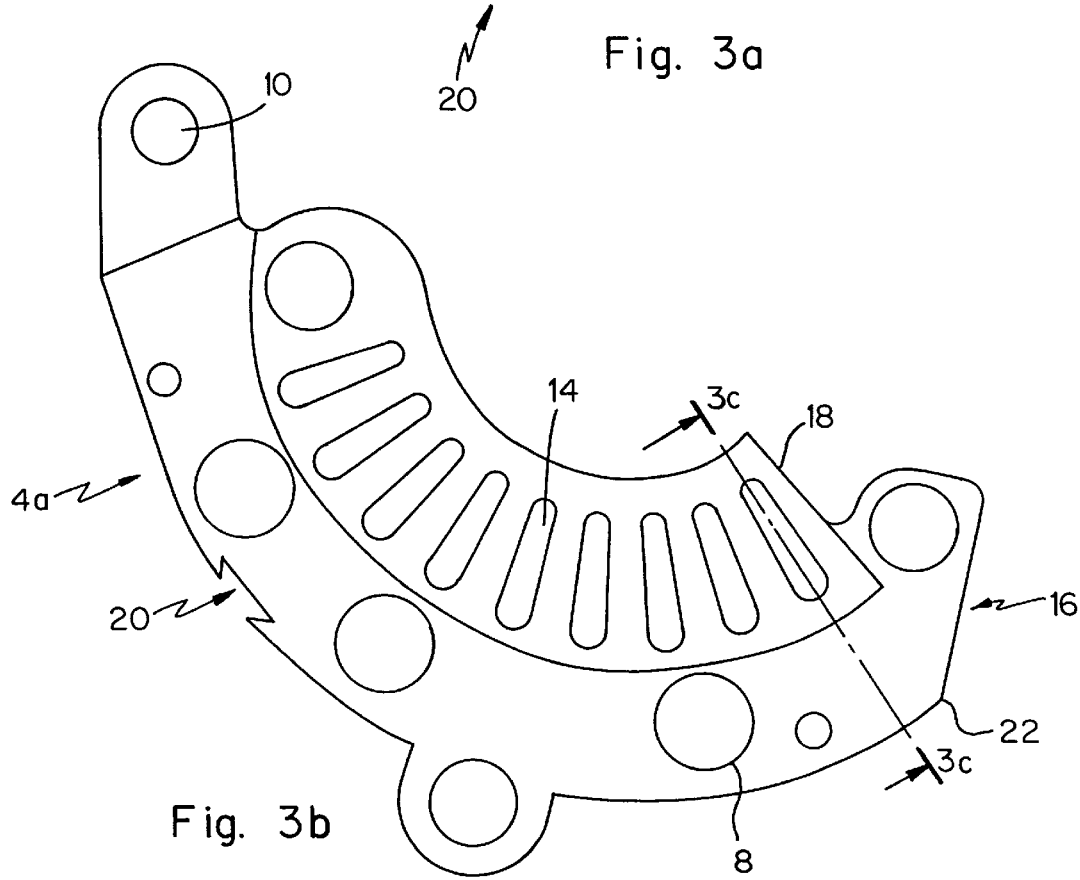

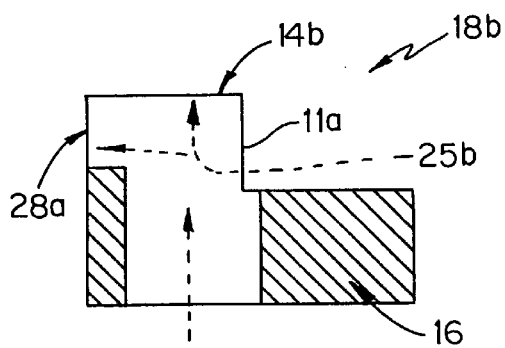
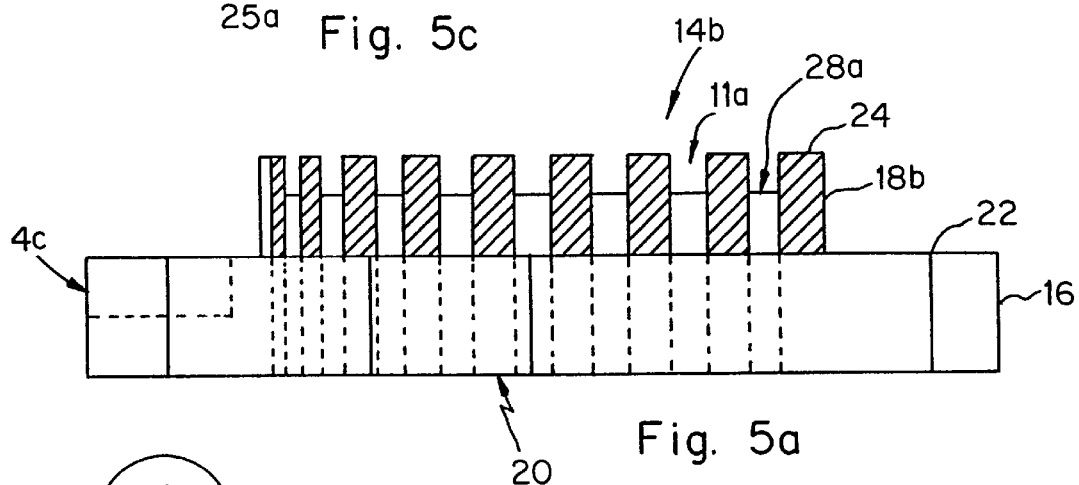
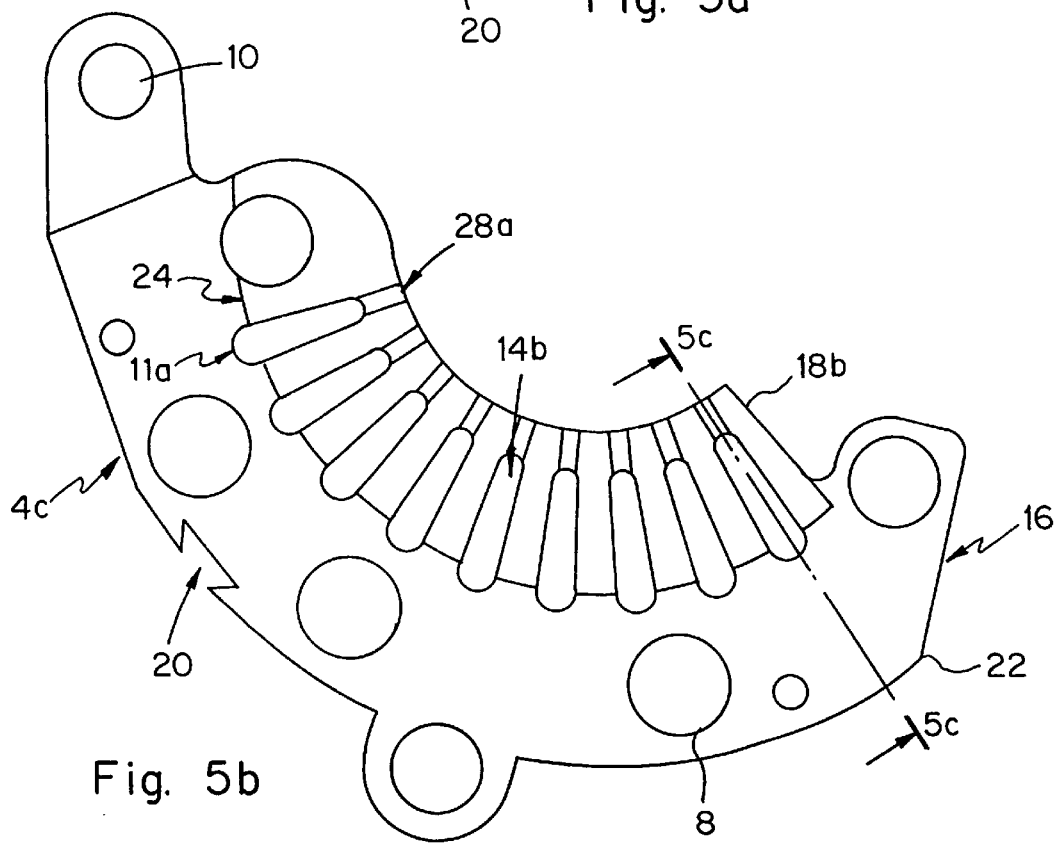

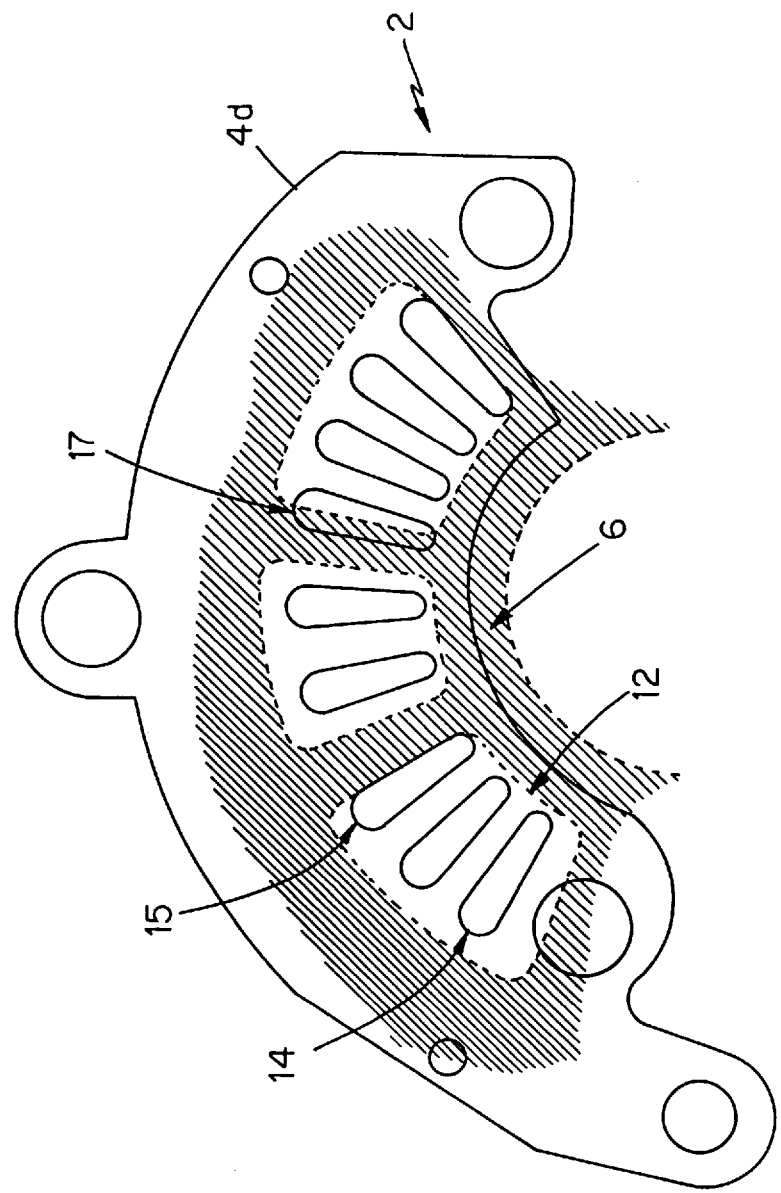

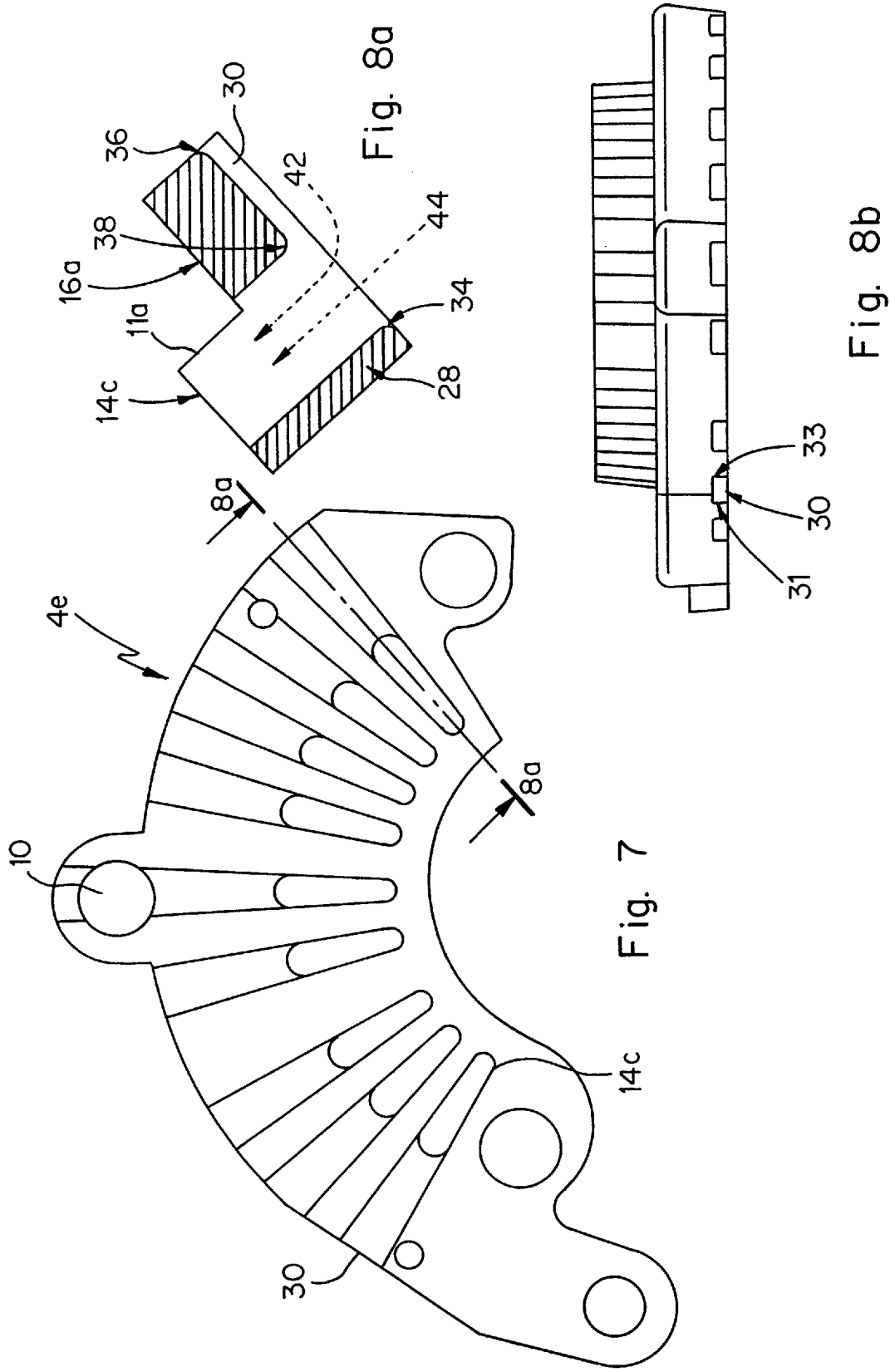

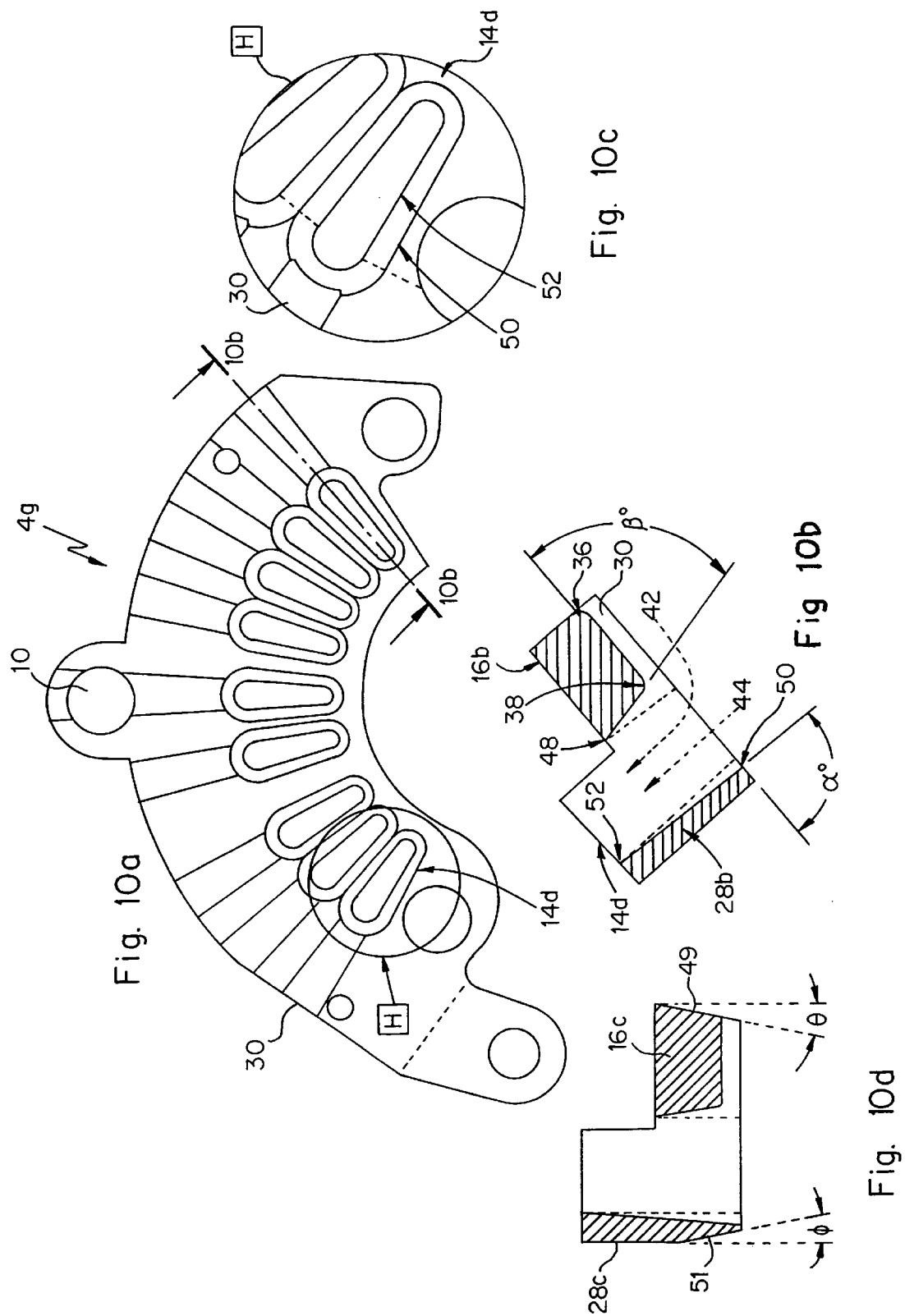

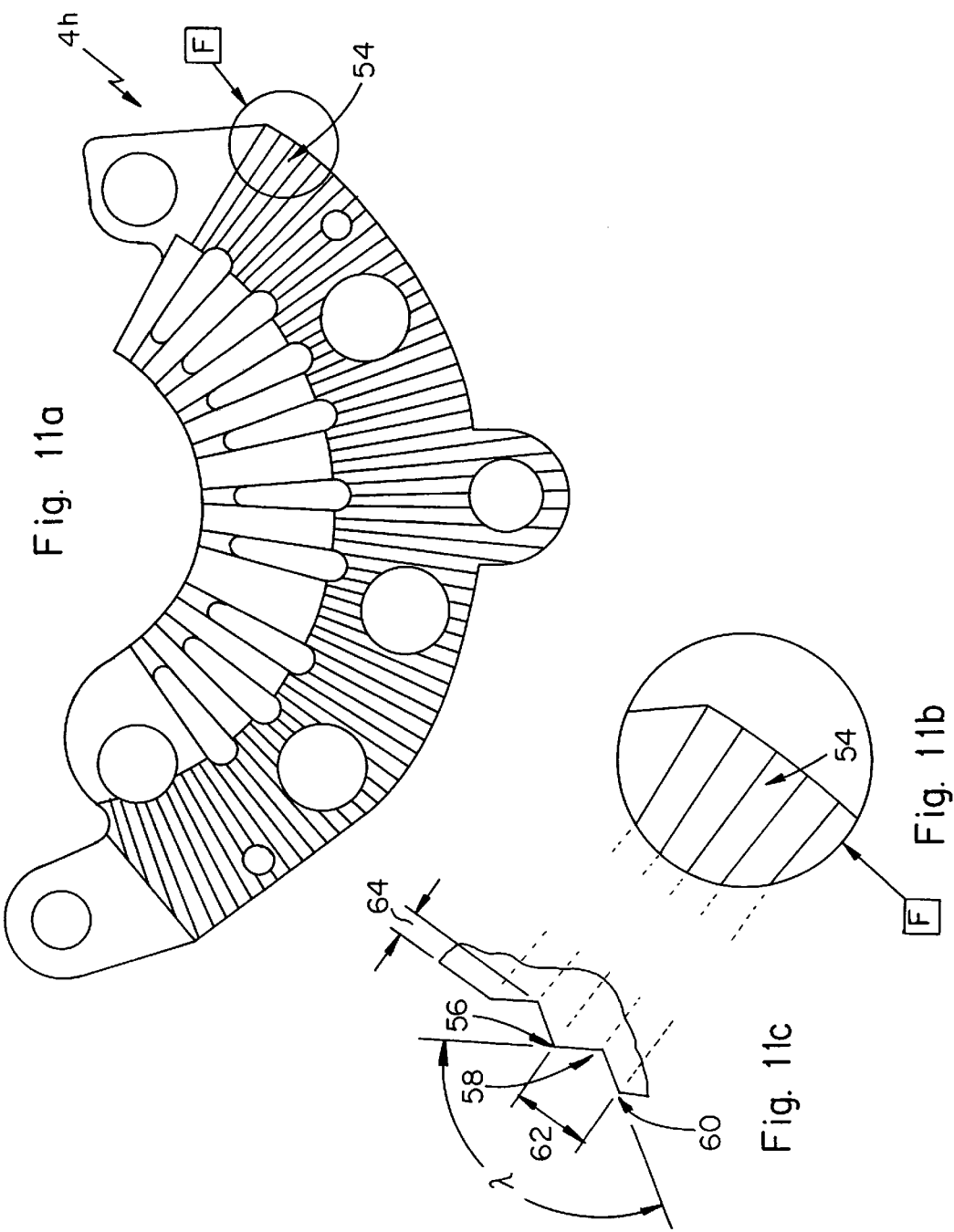

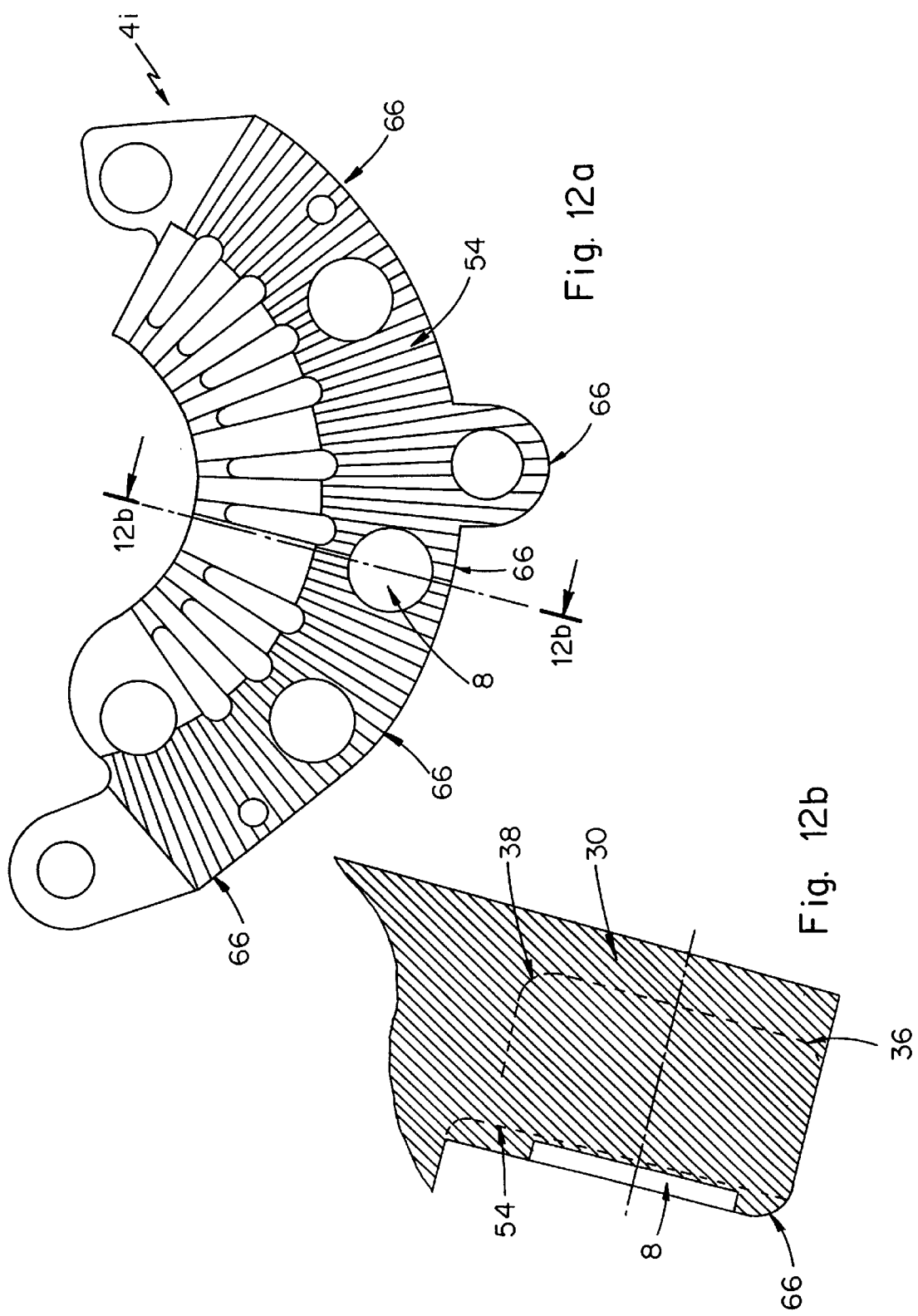

$a_1$    18.7°
$a_2$    13°
$a_3$    14.8°
$a_4$    11.5°
$a_5$    R16
$a_6$    40°
$a_7$    31°
$a_8$    38.84
$a_9$    28.9

$b_1$    2
$b_2$    5° (max.)
$b_3$    5° (max.)
$b_4$    5° (max.)
$b_5$    10°
$b_6$    R0.5

$c_1$    R1
$c_2$    R20
$c_3$    R28.5
$c_4$    R1.5

$e_1$    5.1
$e_2$    9.4
$e_3$    17.5

$f_1$    14.73
$f_2$    R28.5
$f_3$    11.50°
$f_4$    11.5°
$f_5$    5.3
$f_6$    24.8
$f_7$    16.6
$f_8$    26.1
$f_9$    31.9
$f_{10}$  35.6

Rn = Radius in mm from relevant reference point, circle or circle portion having this radius.

Fig. 18

BRIDGE RECTIFIER FOR DIODE-RECTIFIED ALTERNATING CURRENT GENERATOR

This application is related to U.S. patent application Ser. No. 08/571,373 filed on Dec. 13, 1995.

FIELD OF THE INVENTION

The present invention generally relates to bridge rectifiers for rectifying electrical current output from an alternating current generator, and more particularly, to an improved bridge rectifier which utilizes an improved carrier plate heat sink which more efficiently dissipates heat to properly cool the carrier plate while providing current to various electrical loads such as, for example, a motor.

BACKGROUND OF THE RELATED ART

Bridge rectifiers are used to rectify current output from alternative current sources, such as an alternating current generator. Bridge rectifiers for motor vehicle alternators are well known in the art and generally include two metal parts used as heat sinks that are electrically insulated from each other. As a result of the current which is transmitted therethrough, the bridge rectifier becomes heated due to the internal power loss on each individual diode. Thus, the bridge rectifier must be properly cooled in order to handle the maximum required current while still being tolerant to increased temperatures due to internal power losses.

Each of the metal parts or carrier plates include semiconductor diodes which are arranged to polarize the two metal parts into respective positive and negative direct voltage output terminals. The diodes are then connected to respective phase windings of an output winding of the alternating current generator.

The rectifier diodes are connected to respective carrier plates, and these carrier plates are used as heat sinks for these diodes as well. The rectifier diodes are typically inserted by pressure in receiving bore holes of the carrier plate or heat sink, or are soldered to the carrier plate using appropriate solder alloys. The end wires connected to the rectifier diodes enable the rectifier diodes to be connected to external sources.

The heat sinks are typically constructed in the shape of a circle or crescent and are fastened in the same plane to the alternating current generator.

Various difficulties or problems have occurred using this standard diode rectifier. For example, since the diode rectifier is mounted to an alternating current generator which is used with a motor, there are space limitations within the motor, for example, which limit the size of the diode rectifier. One prior art solution to this problem is constructing or fabricating the carrier plates which are connected to the rectifier diodes into a shape which is more than a half circle approximating the circular shape of the alternating current generator. The carrier plates are constructed as a positive heat sink and a negative heat sink and the two heat sinks are arranged coaxially in separate planes spaced apart by an axial distance from one another. See, for example, U.S. Pat. No. 4,952,829 to Armbruster et al., incorporated herein by reference.

Another problem which has been experienced with diode rectifiers includes the need to carefully match the diode characteristics in order to avoid imbalance in the amount of current conducted by the individual diodes. If thermal imbalance is experienced, certain diodes will increase current flow which may result in thermal runaway. Thermal runaway involves a diode which is unable to regulate its current flow and temperature. In this situation, the diode conducts increased current and experiences increased temperature until the individual diode is no longer able to conduct such a high current or experience such a high temperature, and the diode becomes destroyed. Frequently, thermal runaway results in the destruction of an individual diode, and the destroyed diode becomes short circuited thereby rendering the entire bridge rectifier inoperative.

Another problem which has been encountered in bridge rectifiers is that the bridge rectifiers must not only be able to withstand normal battery charging current, but must also be able to supply current, perhaps as much as ten times the normal charging current. These increased current situations may occur, for example, when the motor vehicle is being started. Bridge rectifiers, as discussed, are typically unable to absorb or conduct these types of excess currents and are also unable to rapidly dissipate the resulting heat. Thus, the heat generated within the bridge rectifier may destroy the individual diodes. In order for bridge rectifiers to handle these types of excessive currents and heat, it becomes necessary to utilize a bridge rectifier which has higher current handling capability. Due to the space limitations of the alternating current generator, it then becomes very difficult to provide such a bridge rectifier from a feasibility standpoint as well as at an economical cost.

A further attempt at increasing the current capacity and heat dissipating characteristics of the bridge rectifier includes the mounting of semiconductor diode chips onto first and second metallic heat sinks which are electrically insulated from each other by a thin sheet of electrical insulating material. The diode chips are then covered by a protective insulating coating after connection to the respective heat sink. One of the metallic heat sinks includes a finned area which is subjected to cooling air when the bridge rectifier is mounted to the generator. The heat sink with the plurality of fins includes twelve air passages. This type of bridge rectifier is shown in U.S. Pat. No. 4,606,000 to Steele et al., incorporated herein by reference.

FIGS. 1a–1b are illustrations of a similar bridge rectifier as depicted in Steele et al. In FIG. 1a, combined alternator cover and carrier plate 2 includes carrier plate or heat sink 4 connected to alternator cover 6 (only partially depicted to expose underlying plate 4). Carrier plate 4 includes receiving bore holes 8 which are formed for receiving the diodes. Carrier plate 4 includes alternator mounting holes 10 for mounting carrier plate 4 to the alternator cover 6 via standard connection means such as a bolt or screw connection. Alternator cover 6 includes three main alternator air passages which interact with the twelve air passages 14 in corner plate 4, thereby cooling radiating fins 13. As depicted in FIG. 1b (alternator cover 6 omitted for simplicity), carrier plate 4 is of a rectangular shape (in side view) having the air passages 14 completely disposed within carrier plate 4.

FIG. 2 is an illustration of the positioning of the bridge rectifier 1 within a standard alternating current generator generally designated with reference letter G. As depicted in FIG. 2, the completely assembled bridge rectifier 1 which includes carrier plate 4 and cover 1a is connected to alternator cover 6 via any standard connection means, such as screws 7. Reference numeral 3 denotes the bottom of carrier plate 4, while reference numeral 5 denotes the top of carrier plate 4. Bridge rectifier 1 is also connected to regulator 9. As mentioned previously, the standard bridge rectifier shown in Steele et al. and FIGS. 1a–1b are well known in the art and may also be purchased from Wetherill Associates, Inc. of Royersford, Pa. as part no. 31-113 including cover part no. 46-1858.

While there have been, as described above, several attempts to increase the current and heat capacity of the bridge rectifier, none of these prior attempts have been completely satisfactory. That is, none of these prior art attempts have increased the current and heat capacity of the bridge rectifier in an economical manner.

As a result of our dissatisfaction with existing bridge rectifiers, we have discovered a significant problem which is the basis of the poor performance characteristics of prior art bridge rectifiers. This problem resides in the poor performance characteristics of the carrier plate, and the resulting defects or failures which arise therefrom. In addition, we have also recognized that while the surface area of the carrier plate is restricted by the circular shape of the alternating current generator, the depth of the carrier plate is not. Also, we have discovered new configurations of the carrier plate which more evenly distribute the electric current and resulting heat and more efficiently cool the carrier plate by facilitating increased passage or flow of air through the carrier plate.

SUMMARY OF THE INVENTION

It is therefore, a feature and benefit of the present invention to provide an improved bridge rectifier which is able to increase the current and heat capacity characteristics of the bridge rectifier at an economical cost.

It is another feature and advantage of the present invention to provide an increased current and heat capacity bridge rectifier which includes a reduced number of air passages and radiating fins in the carrier plate. The air passages have been widened and the radiating fins have also been increased in width in order to permit additional air to flow into the carrier plate while maintaining a strong structural base in the carrier plate to provide the necessary heat dissipation and current handling capabilities.

It is another feature and advantage of the present invention to provide for the carrier plate increased height thereby increasing the amount of metal in the carrier plate to increase the current and thermal characteristics. We have discovered that while it is difficult to increase the surface area of the carrier plate in the radial direction, i.e., in the same plane as the carrier plate, it is nevertheless possible to increase the depth or height of the radiating fin section in the carrier plate to be coextensive with the cover of the carrier plate since this additional space had not been previously utilized.

It is another feature and advantage of the present invention to reposition the air passages in the carrier plate with respect to the alternator cover passages in order to optimize or increase the amount of air which may flow from the alternator through the air passages in the carrier plate. This additional air which flows through the passages and through the carrier plate thereby permits enhanced cooling of the carrier plate. The carrier plate is then able to dissipate additional heat due to higher currents.

As another feature and advantage of the present invention, the present invention provides air passages in the carrier plate which include slots which are exposed to the outside for entraining additional air in the carrier plate.

It is another feature and advantage of the present invention to provide bottom channels in the carrier plate which extend from the inner radius of the carrier plate to the air passage on the bottom of the carrier plate for permitting air to pass beneath the diodes, enhancing the cooling of the diodes. These bottom channels may also be filleted or rounded up for better air admission or intake.

Another feature and advantage of the present invention is the repositioning of the diode receiving bore holes in the carrier plate to equalize the distances between each of the diodes when mounted in the carrier plate. This positioning of the diodes equalizes or creates more uniform heat dissipation throughout the carrier plate. By positioning the diodes in a symmetrical fashion in the carrier plate, the thermal stress is reduced by equalizing the amount of HGAT which is conducted by the carrier plate.

Another feature and advantage of the present invention is the specific configuration of the air passages within the carrier plate. In particular, the inner walls of the air passages have been filleted or angled from the bottom of the carrier plate to the top of the carrier plate to increase the speed of the air which enters the bottom channels in the carrier plate. This increase in air speed provides a faster flow of air through the carrier plate, thereby providing better cooling characteristics.

Another feature and advantage of the present invention is the providing of ridges on the surface area of the carrier plate which create an air wrap from the bottom to the top of the carrier plate. These ridges provide channels for drawing the air directly into the air passages from the surface of the carrier plates, and thereby, provide enhanced cooling of the carrier plate.

Another feature and advantage of the present invention is to fillet or round the various edges of the carrier plate for improving the air flow over the diode area in the carrier plate. The edges are rounded without significantly reducing the amount of metal in the carrier plate which might reduce the carrier plate's capacity to conduct electricity and dissipate heat.

The present invention advantageously includes identification and consideration of the following factors:

Rectifying Factors:

Most alternators are 3-phase type. The 'rotor' field rotation (when running DC current through it) generates AC current on the 3 fixed isolated windings of the 'stator' field, called phases. There are two typical connections of the 3 phases, i.e., in a triangle and in a star. In both types, each phase is connected on one of its edges to a pair of diodes: to one diode on its anode and to the other diode on its cathode. The positive cycle of the AC current goes to the anode, and the negative to the cathode. This is rectifying AC to DC. Since there are 3 pairs of diodes, all 3 free cathodes are connected to the (+)BAT, and the free anodes to the (−)BAT, and the DC circle is closed.

Heat:

The electrical current through a diode creates heat. The heat affects negatively the current capability of a diode. Thus, temperature/current capability are in opposite relation. Over a given temperature a diode is destroyed. Therefore on an alternator which generates high current, it is most necessary to cool the diodes by heat sinks and improve the heat dissipation of the heat sinks by increasing the mass and flowing air over/through them.

The present invention satisfies the above features and benefits by providing an improved bridge rectifier for an alternating current generator including a first heat sink having a first set of diodes, and an insulating layer disposed on the first heat sink. In addition, the improved bridge rectifier includes a second heat sink disposed on the insulating layer. The second heat sink includes a base section including first and second areas, a second set of diodes, and diode receiving holes in the base section and receiving the second set of diodes therein. The second heat sink also includes a plateau section disposed on the first area of the base section, and air passages disposed in and extending through the base and plateau sections. The improved bridge rectifier further includes connectors, connecting the first heat sink and the second heat sink together with the insulating layer disposed therebetween, a cover connected to the base section and covering the second area of the base section, and a capacitor connected to the cover and to the second heat sink.

The second heat sink includes at least one of the following: air passages which include external air passage slots opening an external portion of the air passages in the plateau section for enhanced cooling of the second heat sink, or air passages which include internal air passage slots opening an internal portion of the air passages in the plateau section for enhanced cooling of the second heat sink, or air passages which are repositioned to maximize exposure of the air passages to receive air from the alternating current generator, or air passages which include bottom channels formed in the second heat sink for receiving air from the bottom of the second heat sink for enhanced cooling of the second heat sink, or diode receiving holes which are separated by a substantially same distance between each other for balancing thermal stress resulting in uniform heat conduction by the second heat sink, or a second area of the second heat sink includes ridges to increase a surface area of the second area for enhanced cooling of the second heat sink.

In another embodiment, a method of increasing current transferred from a current generating source includes the steps of electrically connecting a carrier plate having a base section to the current generating source, and adding a plateau section on the base section providing additional mass to the carrier plate to improve conductive and heat capacity characteristics of the carrier plate. The method further includes providing air passages disposed in and extending through the base and plateau sections which provide air for cooling the carrier plate.

The method further includes at least one step of providing external air passage slots in the air passages to open an external portion of the air passages in the plateau section providing enhanced cooling of the carrier plate, or providing internal air passage slots in the air passages to open an internal portion of the air passages in the plateau section providing enhanced cooling of the carrier plate, or repositioning the air passages to maximize exposure of the air passages to receive air from the current generating source, or providing bottom channels in the air passages of the carrier plate to receive air from the bottom of the carrier plate providing enhanced cooling of the carrier plate, or providing diode receiving holes separated by a substantially same distance between each other to balance thermal stress resulting in uniform heat conduction by the carrier plate, or providing ridges on the second area of the carrier plate to increase a surface area of the second area providing enhanced cooling of the carrier plate.

These, together with other objects and advantages which will be subsequently apparent, reside in the details of construction and operation as more fully hereinafter described and claimed, with reference being had to the accompanying drawings forming a part hereof, wherein like numerals refer to like elements throughout.

BRIEF DESCRIPTION OF THE DRAWINGS

FIGS. 1a–1b are respective bottom and side views of a bridge rectifier according to the prior art;

FIGS. 3a–3c are respective side, top and section views of the bridge rectifier according to the first embodiment of the present invention;

FIGS. 5a–5c are respective side, top and section views of the bridge rectifier of the present invention including air passage slots;

FIG. 6 is a bottom view of the bridge rectifier of the present invention wherein the air passages have been repositioned;

FIG. 7 is a bottom view of the bridge rectifier including bottom channels;

FIGS. 8a–8b are respective section and side views of the bridge rectifier including bottom channels shown in FIG. 7;

FIGS. 10a–10d are respective bottom, section, enlarged and section views of the bridge rectifier of the present invention including radiating fins and air passages with tilting or angled walls;

FIGS. 11a–11c are respective top and enlarged views of the bridge rectifier of the present invention including ridges on the upper surface of the carrier plate;

FIGS. 12a–12b are respective section and top views of the bridge rectifier of the present invention including fillets along the edges of the carrier plate;

FIG. 18 is a table illustrating the approximate dimensions of the important dimensional characteristics of FIGS. 17a–17f.

DESCRIPTION OF THE PREFERRED EMBODIMENTS

Figure 2:
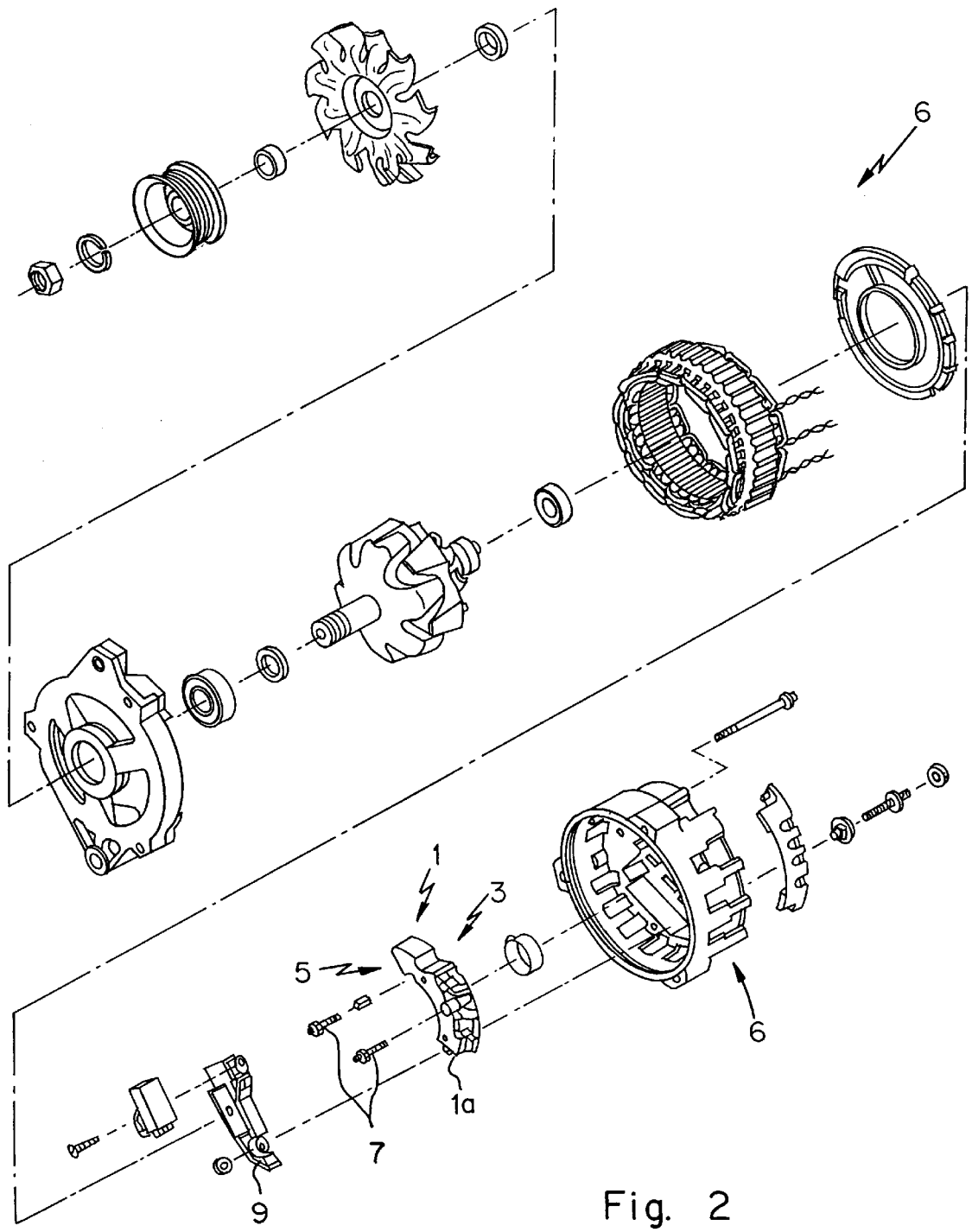
FIG. 2 is an exploded view showing the general connection of the bridge rectifier according to the prior art.

We have discovered that many of the failures which have occurred in the prior art bridge rectifier devices are a result from the failure of the carrier plate in the bridge rectifier to handle excessive current and temperature. We have also discovered that the basic problem which had not been addressed by the prior art is how to make the carrier plate or heat sink itself capable of absorbing or bearing these excessive conditions while still being able to manufacture the bridge rectifier at an economical cost. We have further recognized the problem of space limitations within the alternating current generator, and in particular, the specific configuration of the alternating current generator which imposes various different forms of space limitations on the bridge rectifier when mounted and disposed within the alternating current generator. We discovered that increasing the height of the carrier plate will not implicate these space limitations. Finally, we have recognized the prior art's inability to properly cool the bridge rectifier, since the prior art bridge rectifier was not configured or structured to facilitate the introduction of air to cool the carrier plate and diodes.

Having identified each of the above problems after considerable and careful study, we have solved these problems by providing a bridge rectifier in accordance with the principals of the present invention as discussed below.

FIGS. 3a–3c are various views of the bridge rectifier according to the present invention. In FIG. 3a, carrier plate 4a is illustrated from its side. As shown in FIG. 3a, carrier plate 4a includes the base section 16 with an additional heat conducting plateau section 18. Air passages 14 are arranged to pass through or be disposed within both base section 16 and plateau section 18. The present invention includes this additional heat conducting plateau section 18 because we recognized that while the alternating current generator limits the surface area of the carrier plate, there is additional space which may be utilized within the alternating current generator to increase the height of the carrier plate by providing plateau section 18. Thus, carrier plate 4a includes additional mass or structure which may be utilized to absorb additional increased current and heat conditions.

As shown in FIGS. 3a–3b, carrier plate 4a also includes surface junction 22 which provides an angle shape of carrier plate 4a for disposition within the alternating current generator as well as notch 20 which may also be used for the positioning of carrier plate 4a. Finally, as shown in FIG. 3b, carrier plate 4a includes diode bore holes 8 which are used to receive the diodes and for mounting the diodes to carrier plate 4a.

FIG. 3c is a sectional view of carrier plate 4a in accordance with section lines 3c—3c shown in FIG. 3b. As shown in FIG. 3c, air passage 14 extends through base section 16 and plateau section 18. Plateau wall 11 and external wall 28 are preferably integral with base section 16. However, plateau wall 11 and external wall 28 may be formed of a separate structure using a similar material as base section 16 and joined to base section 16 in accordance with standard techniques in the art. Air enters and exits base section 16 as indicated by arrow 21.

As shown in FIGS. 3a–3c, carrier plate 4a includes nine (9) air passages 14 which is also considered to be a significant advance over the prior art carrier plate which included twelve (12) air passages. In particular, we have discovered that by providing fewer but larger air passages with thicker or more substantial radiating fins, better current absorption and heat tolerance characteristics are experienced by the carrier plate. In particular, it was discovered that by increasing the width of the air passages additional mass was added to carrier plate 4a resulting in increased heat tolerance. In addition, we also discovered that by increasing the size of the air passages, the carrier plate was more efficiently cooled.

Figure 4C:
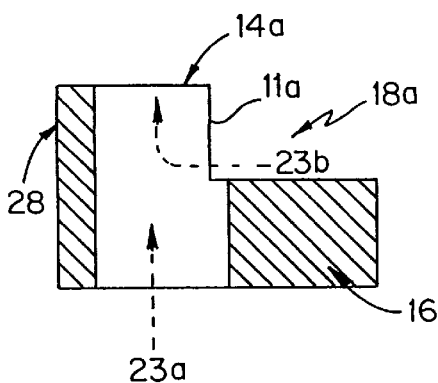
FIGS. 4a–4c are respective side, top and section views of the bridge rectifier of the present invention including cut out passages.
Figure 4A:
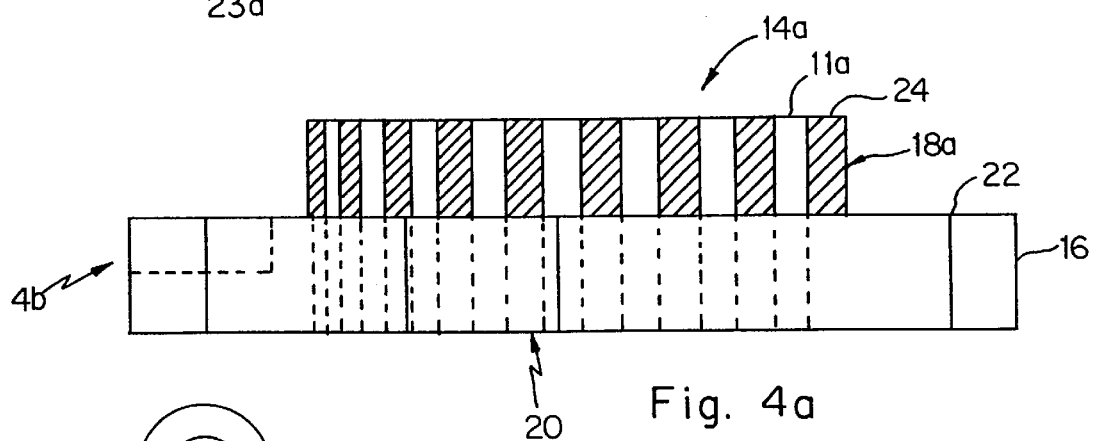
Figure 4B:
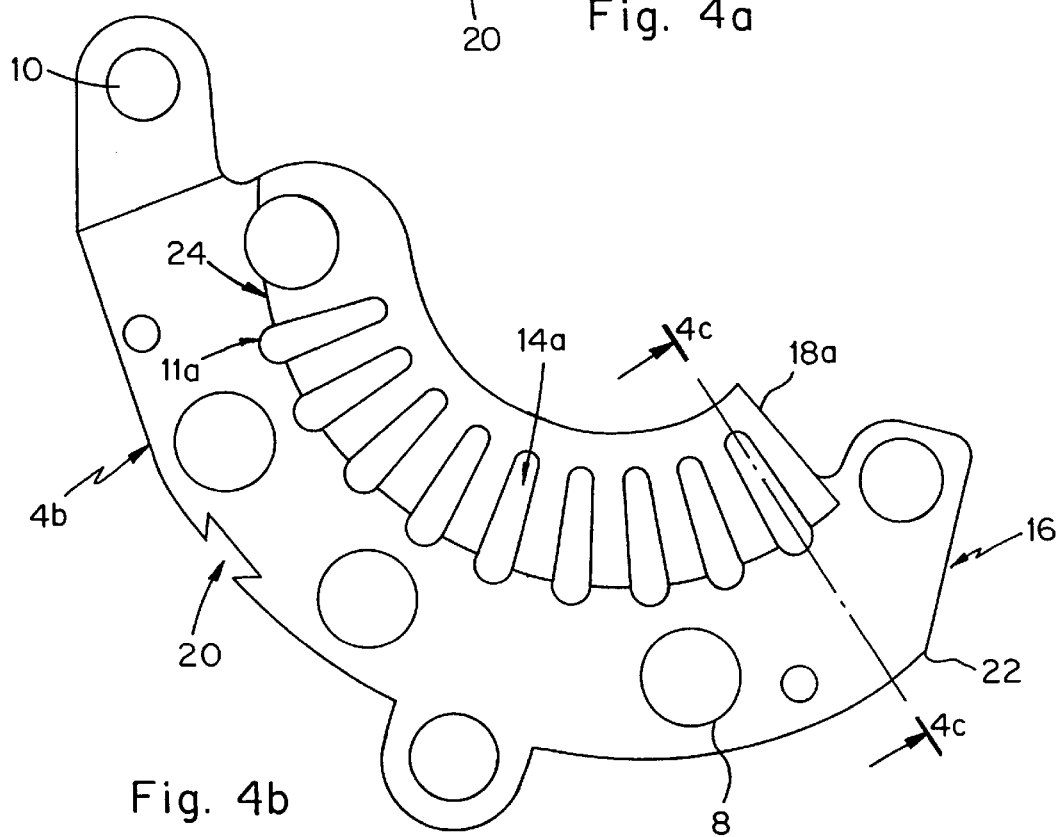

FIGS. 4a–4b are respective side and top views of carrier plate 4b of the present invention including cut-out air passages 14a. As a result of air passages 14a, alternating air passage slots 11a and plateau components 24 are formed in the modified plateau section 18a. Air passage slots 11a provide additional ventilation and more even distribution of the air which is entrained from the alternating current generator throughout carrier plate 4b for more efficient cooling of the base section 16 and additional heat conducting plateau section 18a as well as the diodes which are inserted in diode bore holes 8.

FIG. 4c is a cross section of cut-out air passages 14a as shown by the sectional lines 4c—4c in FIG. 4b. As shown in FIG. 4c, cut-out air passage 14a extends through plateau section 18a and base section 16. In addition, cut-out air passage 14a includes air passage slot 11a for increased ventilation of carrier plate 4b and the diodes which are positioned therein. Air enters and exits base section 16 as indicated by arrow 23a, and additional air enters and exits plateau section 18a as indicated by arrow 23b. As indicated previously, the present invention recognizes that failures in the bridge rectifier were resulting, in part, due to the carrier plate's inability to be properly cooled, as well as the carrier plate's inability to properly cool the diodes which were imbedded therein. Thus, cut-out air passages 14a provide additional ventilation in cooling of carrier plate 4b and the diodes.

FIGS. 5a–5b illustrate respective side and top views of carrier plate 4c including internal air passage slots 28a. As shown in FIGS. 5a and 5b, carrier plate 4c includes base section 16 and plateau section 18b. Additional heat conducting plateau section 18b includes air passage slot 11a as well as internal air passage slot 28a. Additional internal air passage slot 28a provides additional cooling by permitting air to more readily flow through plateau components 24 of plateau section 18b into air passages 14b.

FIG. 5c is a sectional view of section 5c—5c designated in FIG. 5b. As shown in FIG. 5c, air passages 14b include air passage slot 11a as well as internal air passage slot 28a. As explained above, this additional internal air passage slot 28a provides enhanced cooling and ventilation throughout carrier plate 4c thereby providing a bridge rectifier with enhanced current dissipation and temperature tolerance. Air enters and exits base section 16 as indicated by arrow 25a, and additional air enters and exits plateau section 18b as indicated by arrows 25b.

FIG. 6 is a bottom view of the bridge rectifier of the present invention, wherein the air passages have been repositioned to facilitate air flowing from the alternating current generator to bridge rectifier 2 via alternating cover 6. As shown in FIG. 6, air passages 14 in carrier plate 4d have been repositioned to minimize the amount of overlap between air passages 14 and alternator cover 6 by maximizing the number of air passages which are exposed to main alternating air passages 12 of alternator cover 6. As also shown in FIG. 6, nine air passages are illustrated where only half of air passage 17 is covered by alternator cover 6 and all of air passage 15 is exposed through main alternator air passage 12. Thus, only a total of half of one air passage is unable to be used for receiving air from the alternating current generator for cooling carrier plate 4d of bridge rectifier 2. In contrast, FIG. 1a of the prior art shows that at least two air passages 14 are covered by alternator cover 6, thereby reducing the amount of air which is introduced to carrier plate 4, resulting in inefficient cooling of carrier plate 4.

FIG. 7 is a bottom view of the carrier plate in accordance with the present invention which includes bottom channels. As shown in FIG. 7, carrier plate 4e includes bottom channels 30 which extend underneath air passages 14c for enhanced cooling of carrier plate 4e.

FIGS. 8a–8b are respective section and side views of carrier plate 4e. In particular, FIG. 8a is a sectional view of section 8a—8a which is illustrated in FIG. 7. As shown in FIG. 8a, air passage 14c includes bottom channel 30 which permits air to enter air passage 14c as shown by reference numerals 42 and 44. External wall 28 has been rounded at the bottom near bottom channels 30 to facilitate air introduction in air passage 14c. Base section 16a is also preferably rounded at corners 36 and 38 to further facilitate air introduction in bottom channel 30. Note that the rounding at corners 34, 36 and 38 are preferably minor in nature to prevent any significant amount of mass or material being removed from carrier plate 4e thereby preventing any significant reduction in current dissipation and temperature characteristics of the bridge rectifier.

FIG. 8b also shows that bottom channel 30 is rounded at corners 31 and 33 to further facilitate air introduction and cooling of carrier plate 4e.

Figure 9:
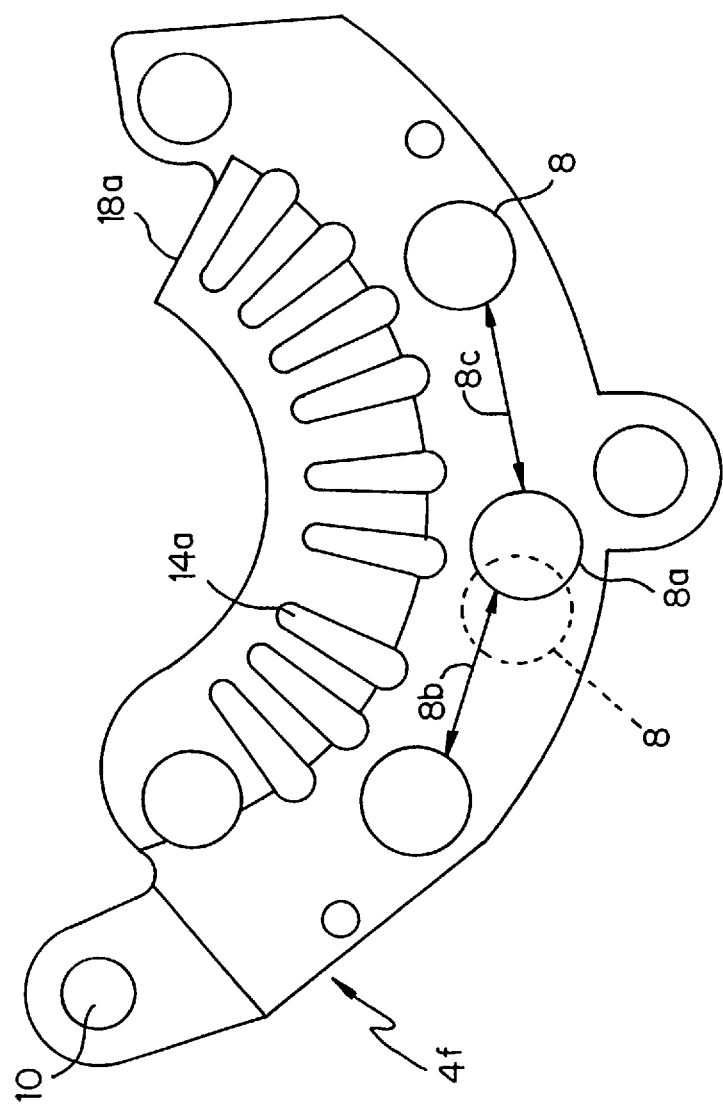
FIG. 9 is a bottom view of the bridge rectifier of the present invention illustrating the repositioning of the diode bore hole.
Figure 13A:
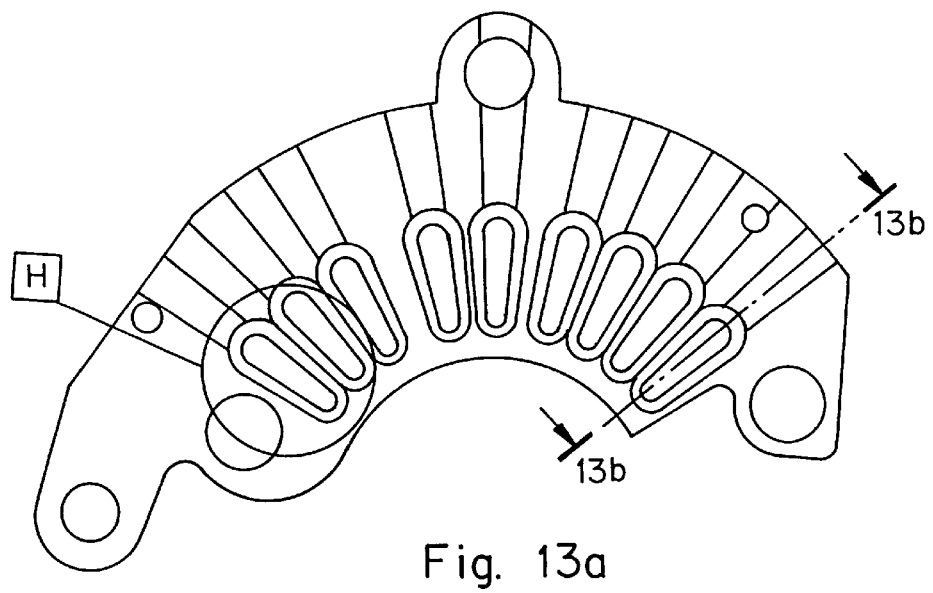
FIGS. 13a–13f are combined views of the various features of the present invention illustrated together.
Figure 13D:
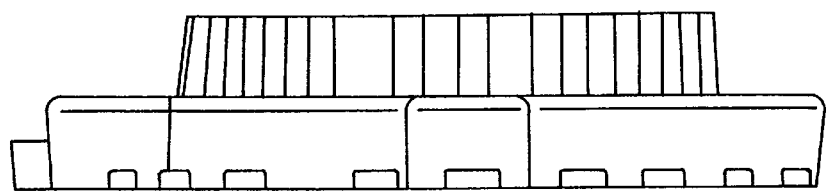
Figure 13F:
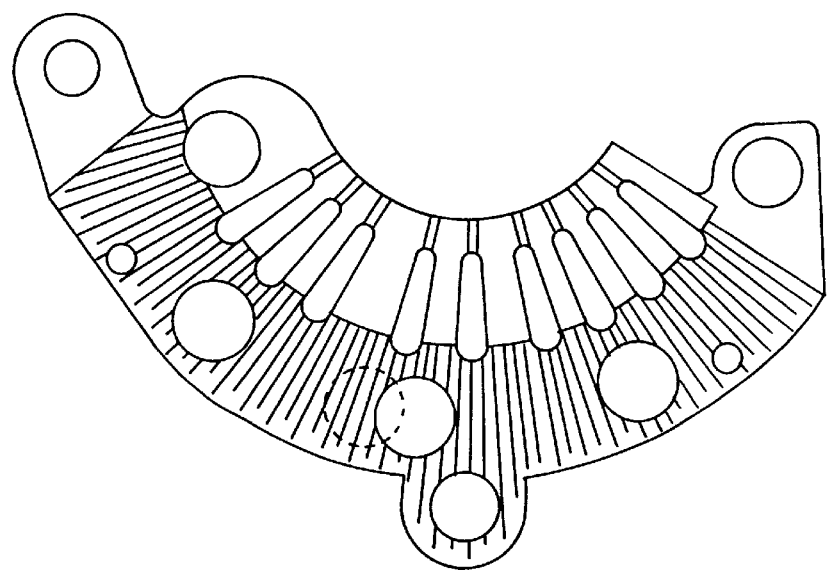
Figure 13B:
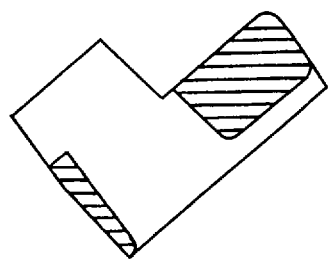
Figure 13C:
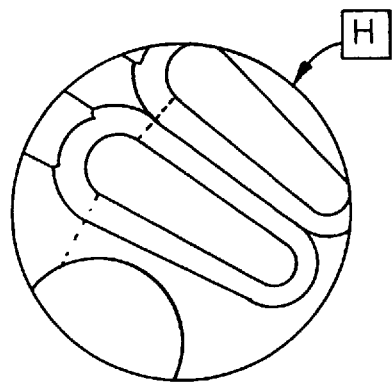
Figure 13E:
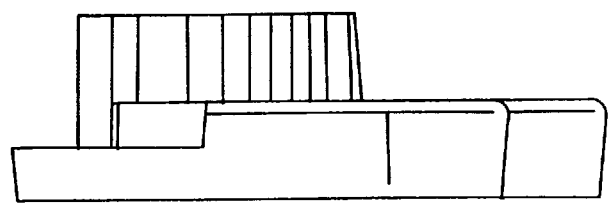

FIG. 9 is a bottom view of carrier plate 4f of the present invention which illustrates the repositioning of the diode bore holes for equalized current dissipation of the carrier plate. In FIG. 9, carrier plate 4f has the center diode bore hole 8 transferred or repositioned to diode bore hole 8a as illustrated. This repositioning of diode bore hole 8a results in distances 8b and 8c being substantially similar to each other. Thus, all three of the diode bore holes are separated by approximately the same distance from one another to further facilitate more uniform heat dissipation of carrier plate 4f.

FIG. 10a is a bottom view of the carrier plate of the present invention which includes radiating fins and air passages with tilting or angled walls. As shown in FIG. 10a, carrier plate 4g includes air passages 14d to have tilting or angled walls. FIG. 10c is an enlarged view of the tilting or angled walls of air passages 14d. As shown in FIG. 10c, air passages 14d are angled to have a greater opening at the bottom of carrier plate 4g and to have a smaller opening at the top of carrier page 4g. This angling of air passages 14d permits additional air to enter air passage 14d and be accelerated through the air passage for additional or enhanced cooling of carrier plate 4g.

FIG. 10b is a sectional view of air passage 14d in accordance with section 10b—10b as shown in FIG. 10a. As shown in FIG. 10b, air passage 14d preferably includes bottom channel 30 for permitting air designated by reference numerals 42 and 44 to enter from the bottom of carrier plate 4g. Bottom channel 30 is also preferably rounded at areas 36 and 38 as described previously. Base section 16b and external wall 28b are constructed so as to lean or tilt from the bottom to the top of carrier plate 4g as illustrated between points 38 and 48 of section 16b and between points 50 and 52 of external wall 28b. This tilting of base section 16b and external wall 28b creates acute angles beta β and alpha α, respectively which provide the angle of the tilting of air passage 14d.

FIG. 10d is another sectional view of air passage 14d which also includes the additional tilting of base section 16c at area 49 and external wall 28c at area 51 which results in angles theta θ and phi φ respectively. This additional tilting of base section 16c and external wall 28c on the external portions of the carrier plate, also facilitate additional or increased heat dissipation and temperature characteristics of the carrier plate without substantially removing a significant amount of mass from the carrier plate which would hinder current dissipation and heat absorption characteristics.

FIGS. 11a–11c are top and enlarged views of the carrier plate 4h of the present invention including ridges on the upper surface of the carrier plate. As shown in FIG. 11a, carrier plate 4h includes ridges 54 which have been enlarged in FIGS. 11b and 11c. As shown in FIGS. 11b–11c, ridges 54 include peaks 56 and 60 and low point 58 creating spacing 62 between ridges and depth 64 of the ridges. In addition, each ridge 54 is configured in accordance with a predetermined angle such as lambda λ as shown in FIG. 11c. This ridging of the upper surface of carrier plate 4h creates additional surface area for absorbing and dissipating current and temperature to enhance the operability of carrier plate 4h. Further, these ridges also facilitate the introduction of air to the air passages by providing a more focused passageway which creates an air wrap over the surface of carrier plate 4h. Thus, carrier plate 4h experiences enhanced cooling and current dissipation characteristics which have been unable to have been achieved by the prior art.

FIGS. 12a–12b are respective top and section views of the carrier plate of the present invention including fillets along the edges of the carrier plate. As shown in FIG. 12a, carrier plate 4i includes ridges 54 with fillets 66 along the outer edges of the carrier plate. FIG. 12b is a section view as illustrated by section lines G—G in FIG. 12a. As shown in FIG. 12b, diode bore hole 8 is positioned amidst ridges 54 with fillet 66. Also shown is the positioning of bottom channel 30 with rounded edges 36 and 38 within carrier plate 4i. Thus, these additional fillets 66 facilitate the flow of air from the external of carrier plate 4i toward the air passages which allows additional air to flow over the diodes positioned in diode bore holes 8 and provide additional cooling to the carrier plate 4i as well as, in particular, the diodes implanted in carrier plate 4i.

FIGS. 13a–13f are views of the various features of the carrier plate of the present invention all viewed together. Since these various views have been discussed in detail in connection with FIGS. 3a–12b, additional discussion of these figures is not necessary.

Figure 14A:
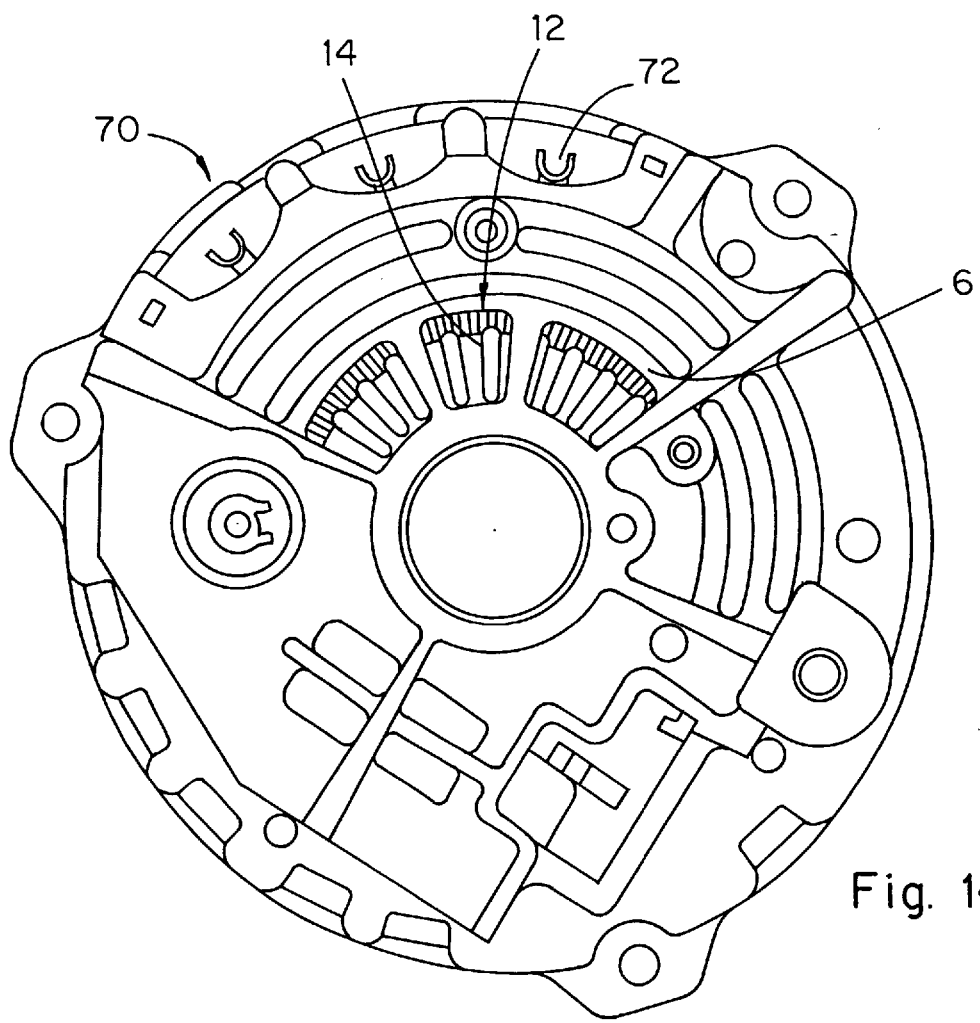
FIGS. 14a–14b are respective top and side views of the bridge rectifier of the present invention as mounted to the alternator front cover.
Figure 14B:
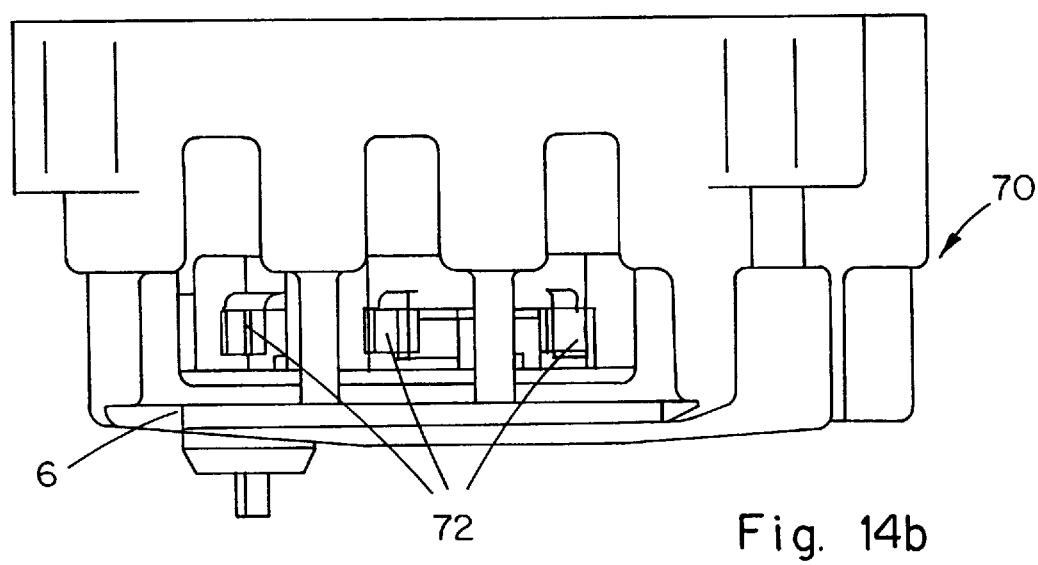

FIGS. 14a–14b are respective top and side views of the bridge rectifier of the present invention as mounted in the alternating current generator. As shown in FIG. 14a, alternating current generator 70 includes the bridge rectifier mounted therein where air passages 14 of the bridge rectifier are exposed via the windows 12 of alternator front cover 6 in accordance with the principals of the present invention. In addition, terminal 72 of the bridge rectifier are exposed for connection to an external source for receiving and limiting the current. FIG. 14b shows similar details from a side view of the alternating current generator.

Figure 15A:
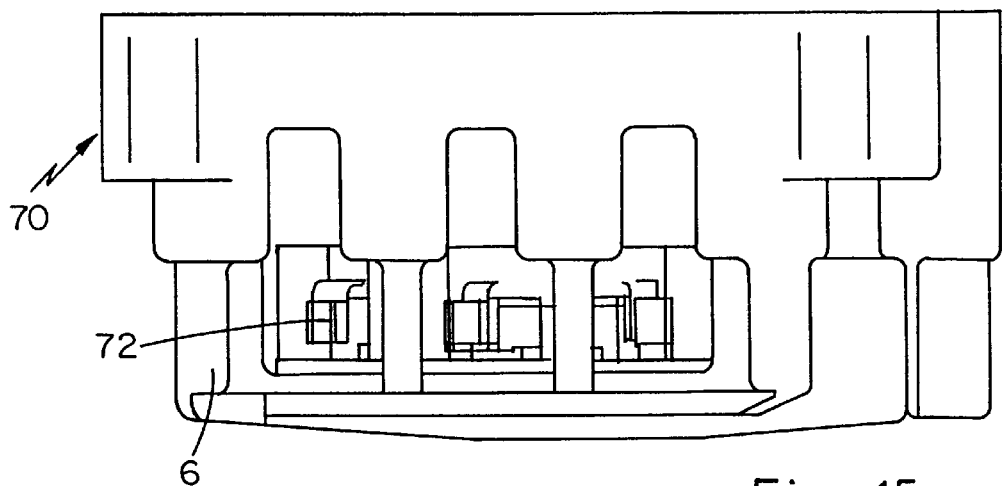
FIGS. 15a–15b are respective side and bottom views of the bridge rectifier of the present invention as mounted to the front cover of the alternator.
Figure 15B:
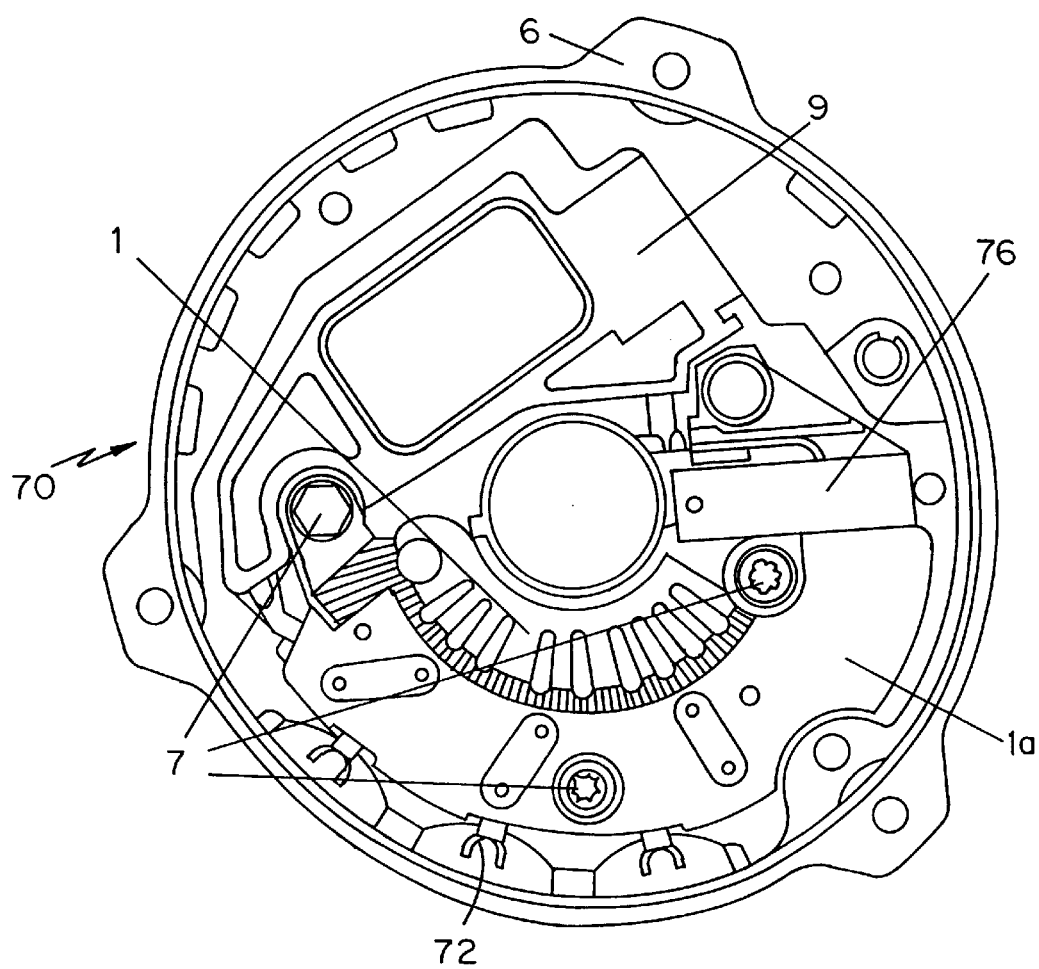

FIGS. 15a–15b are side and bottom views of the bridge rectifier of the present invention as mounted in the alternating current generator. As shown in FIG. 15b, bridge rectifier 1 is mounted within the alternating current generator 70 including rectifier cover 1a. FIG. 15b also illustrates the placement of regulator 9 and brushes 76 with respect to bridge rectifier 1 of the present invention. Alternator front cover 6 is also illustrated in FIGS. 15a–15b as mounted to bridge rectifier 1 via mounting screws 7. Terminals 72 are also illustrated in FIG. 15a which permit bridge rectifier 1 to be connected to external sources such as the alternator front cover.

Figure 16A:
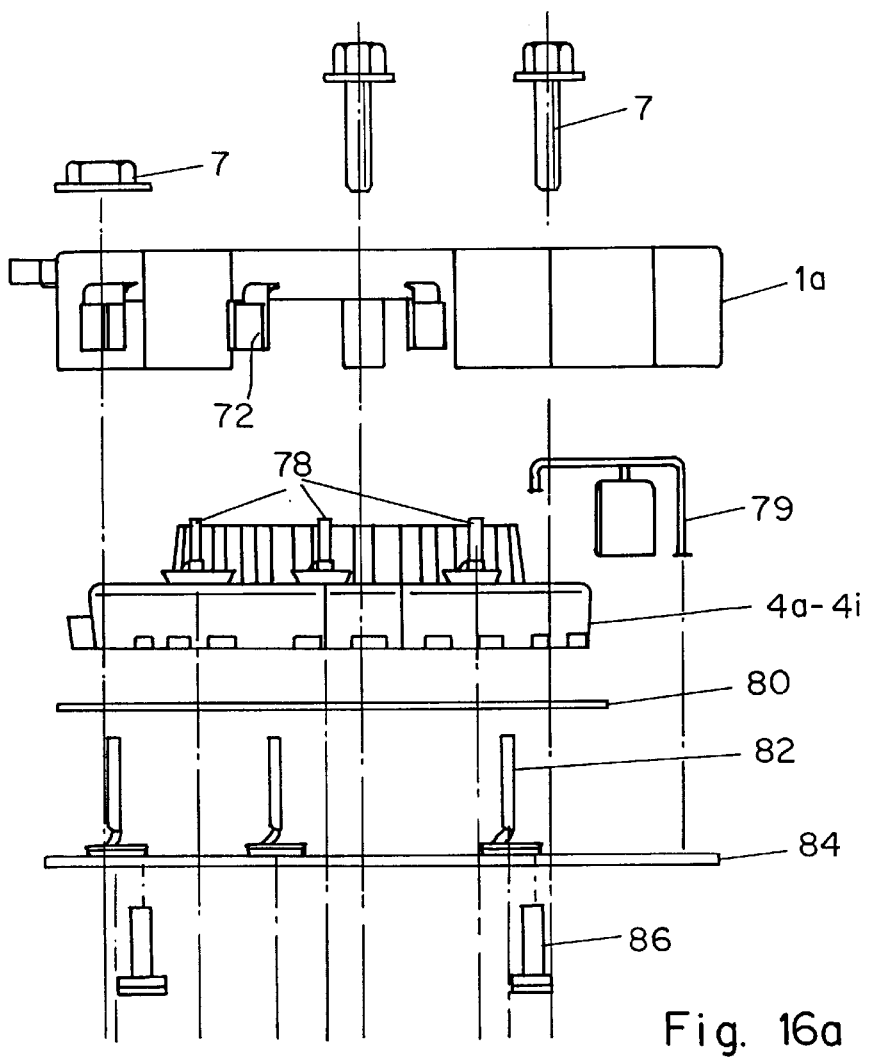
FIGS. 16a–16c are respective exploded, top, and side views of the bridge rectifier of the present invention.
Figures 16B, 16C:
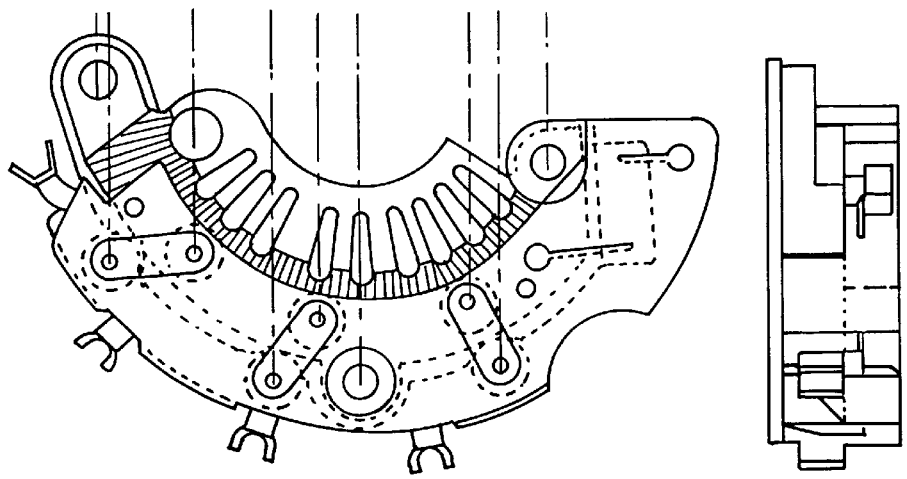
Figure 17A:
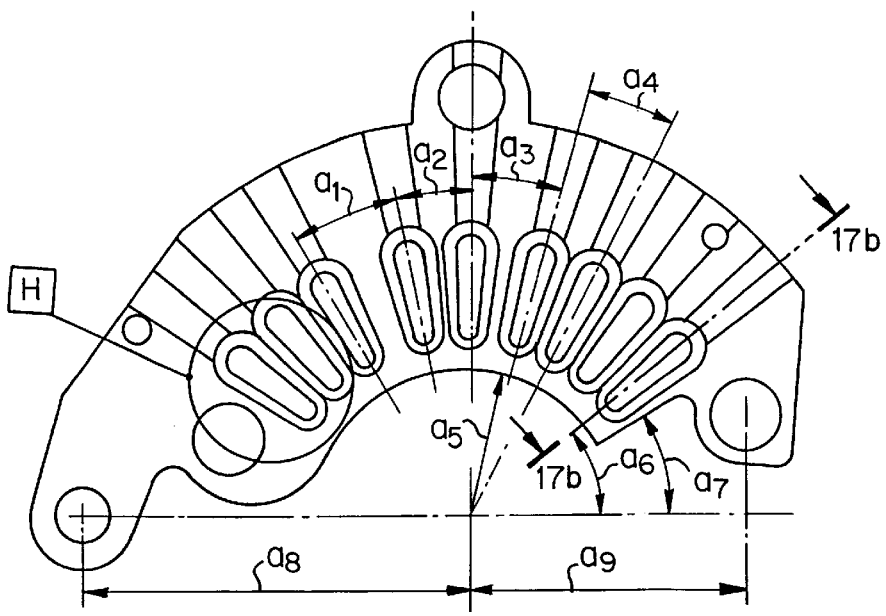
FIGS. 17a–17g are views of the bridge rectifier of the present invention illustrating the important dimensional characteristics.
Figure 17D:
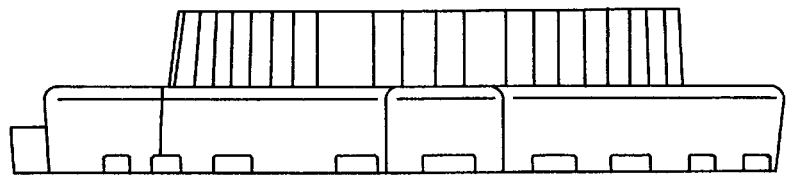
Figure 17F:
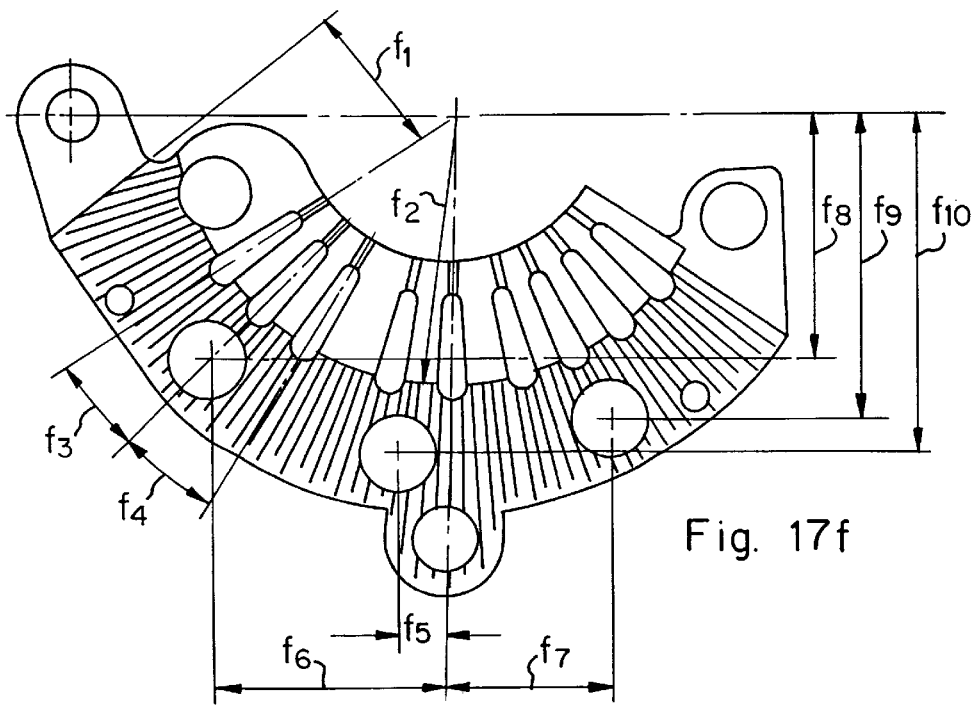
Figure 17B:
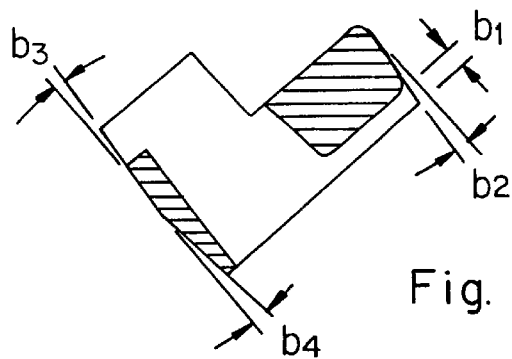
Figure 17G:
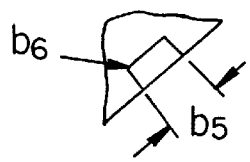
Figure 17C:
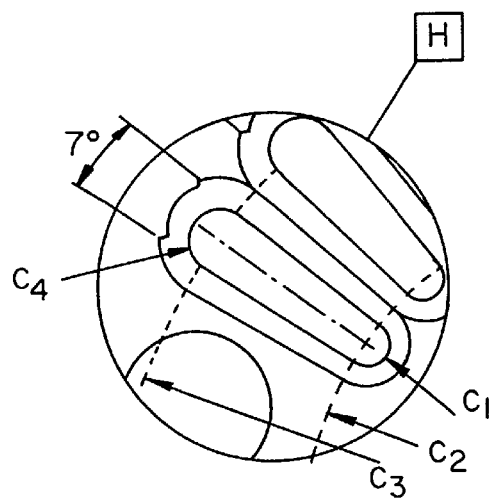
Figure 17E:
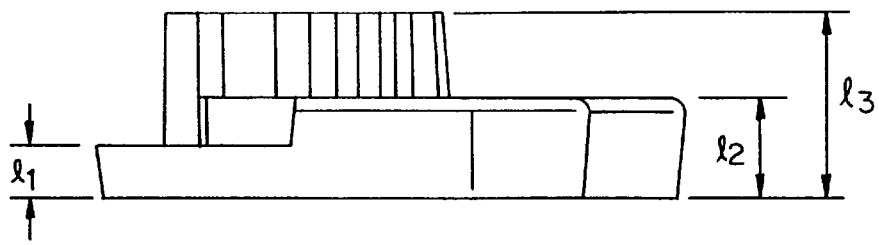

FIG. 16a is an exploded view of the entire construction of the bridge rectifier of the present invention. As shown in FIG. 16a, carrier plates or second heat sinks 4a–4i represent the various configurations of the carrier plate in accordance with the principals of the present invention discussed previously. In addition, diodes 78 are disposed in any of carrier plates 4a–4i as previously discussed in the diode bore holes. Carrier plate 4a–4i is preferably made from aluminum and polarized with a positive charge. In addition, the three diodes 78 which are disposed in the diode bore holes conduct cathode to case. Copper heat sink 84 includes copper heat sink or first heat sink diodes 82 which are soldered to its top surface. Copper heat sink 84 is polarized with a negative charge and the three diodes 82 conduct from anode to case. Insulator 80 is disposed between carrier plate 4a–4i and copper heat sink 84 and is spread with a silicon grease to provide electrical insulation but thermal conductivity between carrier plate 4a–4i and copper heat sink 84. Plastic cover 1a includes copper terminal 72 and receives each of the diodes 78 and 82 for connecting all six diodes to an external source. Terminals 72 are then connected to the alternator, three of which are connected to the stator phases and one of the terminals is connected to the regulator. Capacitor 79 is electrically connected between carrier plate 4a–4i and copper heat sink 84. Plastic rivets 86 are used to connect carrier plate 4a–4i and copper heat sink 84 together and mounting screws 7 mounts the entire structure to the alternator front cover. FIG. 16b shows the structure of the entire bridge rectifier as assembled in correspondence with the exploded view of FIG. 16a, and FIG. 16c shows a side view of the assembled bridge rectifier.

FIGS. 17a–17f are various views of the carrier plate of the present invention illustrating the important dimensional characteristics of the carrier plate. Further, FIG. 18 is a table which provides the approximate dimensions of the important dimensional characteristics as illustrated in FIGS. 17a–17f.

In accordance with the above principals of the present invention, an improved bridge rectifier is provided which is able to limit and absorb higher currents and tolerate increased temperature characteristics by providing an improved carrier plate which is able to be more efficiently cooled and able to tolerate increased current and temperature conditions.

The many features and advantages of the present invention are apparent from the detailed specification, and thus, it is intended by the appended claims to cover all such features and advantages of the invention which fall within the spirit and scope of the invention. Further, since numerous modifications and variations will readily occur to those skilled in the art, it is not desired to limit the invention to the exact construction and operation illustrated and described, and accordingly, all suitable modifications and equivalents may be resorted to falling within the scope of the invention.

We claim:

1. A bridge rectifier for an alternating current generator, comprising:

a first heat sink having a first diode;

an insulating layer disposed on said first heat sink;

a second heat sink disposed on said insulating layer, said second heat sink including a base section including first and second areas;

a second diode;

diode receiving holes in said base section and receiving said second diode therein;

a plateau section disposed on the first area of said base section and constructed to extend above said base section to add additional mass to said second heat sink to improve conductive and heat capacity characteristics of said second heat sink and of the bridge rectifier; and air passages disposed in and extending through said base and plateau sections;

connectors, connecting said first heat sink and said second heat sink together with said insulating layer disposed therebetween;

a cover connected to said base section and covering the second area of said base section; and a capacitor connected to said first heat sink and to said second heat sink.

2. A bridge rectifier as recited in claim 1, wherein said plateau section is substantially even with said cover.

3. A bridge rectifier as recited in claim 1, wherein said plateau and base sections are integral.

4. A bridge rectifier as recited in claim 1, wherein:

the alternating current generator includes a front cover, the bridge rectifier is connected to the front cover forming a connection zone therebetween, the connection zone includes a cavity, and said plateau section extends above said base section and within the cavity of the connection zone.

5. A bridge rectifier as recited in claim 1, wherein said air passages comprise nine air passages for enhanced cooling and increased temperature tolerance of said second heat sink.

6. A carrier plate of a bridge rectifier for use in an alternating current generator, comprising:

a base section including first and second areas;

a plateau section disposed on the first area of said base section, said plateau section constructed to extend above said base section thereby adding additional mass to the carrier plate to improve conductive and heat capacity characteristics of the carrier plate and of the bridge rectifier; and air passages disposed in and extending through said base and plateau sections.

7. A carrier plate as recited in claim 6, wherein said plateau and base sections are integral.

8. A carrier plate as recited in claim 6, wherein said air passages comprise nine air passages for enhanced cooling and increased temperature tolerance of the carrier plate.

9. A carrier plate of a bridge rectifier for use in an alternating current generator, comprising:

base section means including first and second areas, for connecting the carrier plate to an external source;

plateau section means disposed on and constructed to extend above said base section means, for adding additional mass to the carrier plate to improve conductive and heat capacity characteristics of the carrier plate; and air passage means disposed in and extending through said base and plateau sections, for providing air through the carrier plate for cooling the carrier plate.

10. A carrier plate as recited in claim 9, wherein said plateau and base section means are integral.

11. A carrier plate as recited in claim 9, wherein said air passage means comprise nine air passages for enhanced cooling and increased temperature tolerance of the carrier plate.

12. A method of limiting current transferred from a current generating source, comprising the steps of:

electrically connecting a carrier plate having a base section to the current generating source;

adding a plateau section on the base section to extend above said base section and to thereby provide additional mass to the carrier plate to improve conductive and heat capacity characteristics of the carrier plate; and providing air passages disposed in and extending through the base and plateau sections providing air for cooling the carrier plate.

13. A method as recited in claim 12, wherein the plateau and base section means are integral.

14. A method as recited in claim 12, wherein the air passages include nine air passages for enhanced cooling and increased temperature tolerance of the carrier plate.

* * * * *